US006190179B1

(12) United States Patent
Sundaresan

(10) Patent No.: US 6,190,179 B1
(45) Date of Patent: Feb. 20, 2001

(54) METHOD OF MAKING A FIELD EFFECT TRANSISTOR HAVING A CHANNEL IN AN EPITAXIAL SILICON LAYER

(75) Inventor: Ravishankar Sundaresan, Garland, TX (US)

(73) Assignee: STMicroelectronics, Inc., Carrollton, TX (US)

( * ) Notice: Under 35 U.S.C. 154(b), the term of this patent shall be extended for 0 days.

(21) Appl. No.: 08/437,847

(22) Filed: May 9, 1995

Related U.S. Application Data

(62) Division of application No. 08/350,504, filed on Dec. 6, 1994, now Pat. No. 6,064,077, which is a continuation of application No. 08/254,286, filed on Jun. 6, 1994, now abandoned, which is a continuation of application No. 07/752,863, filed on Aug. 30, 1991, now abandoned.

(51) Int. Cl.[7] .................................................. H01L 21/336
(52) U.S. Cl. .............................. 437/41; 438/303; 438/307
(58) Field of Search ........................ 437/29, 44, 40 GS, 437/45, 41 GS, 41 CS, 99, 101; 438/299, 300, 301, 303, 305, 306, 307

(56) References Cited

U.S. PATENT DOCUMENTS

| 4,041,518 | 8/1977 | Shimizu et al. | 437/99 |
|---|---|---|---|
| 4,242,691 | 12/1980 | Kotani et al. | 257/327 |
| 4,270,960 | 6/1981 | Bollen et al. | 437/99 |
| 4,381,202 | 4/1983 | Mori et al. | 437/45 |
| 4,879,255 | 11/1989 | Deguchi et al. | 437/99 |
| 4,905,078 | 2/1990 | Sagara et al. | 357/34 |
| 4,939,386 | 7/1990 | Shibata et al. | 257/336 |
| 4,966,861 | 10/1990 | Mieno et al. | 437/99 |
| 5,091,334 | 2/1992 | Yamazaki et al. | 437/101 |
| 5,196,908 | 3/1993 | Kusunoki et al. | 257/327 |
| 5,213,991 | 5/1993 | Inokawa et al. | 437/41 CS |
| 5,242,844 | 9/1993 | Hayashi | 437/29 |
| 5,245,208 | 9/1993 | Eimori | 257/344 |
| 5,306,667 | 4/1994 | Shappir | 437/41 |
| 5,330,923 | 7/1994 | Kusunoki et al. | 437/40 |
| 5,338,697 | 8/1994 | Aoki et al. | 437/40 |
| 5,378,644 | 1/1995 | Morihara | 437/44 |

FOREIGN PATENT DOCUMENTS

| 0436038A1 | 7/1991 | (EP) . | |
|---|---|---|---|
| 58-192381 | 2/1984 | (JP) . | |
| 6-235471 | 11/1985 | (JP) | 257/345 |
| 236364 | 10/1988 | (JP) | 257/23.3 |
| 282576 | 3/1990 | (JP) | 357/23.3 |

OTHER PUBLICATIONS

7th Biennial University/Government/Industry Microelectronics Symposium, Rochester, NY, Jun. 11, 1987, pp. 28–33, F.C. Jain "Improved LDD–FET Structures With Lightly Dopen N Sheaths Around the N + Source/Drain Regions".

*Primary Examiner*—Brian Dutton
(74) *Attorney, Agent, or Firm*—Theodore E. Galanthay; Lisa K. Jorgenson; Dan Venglarik

(57) ABSTRACT

A method for fabricating an integrated circuit transistor begins with doping the substrate in the device active areas after field oxide regions have been formed. This dopant helps to reduce short channel transistor effects. A thin layer of epitaxial silicon is then grown over the substrate active regions. A field effect transistor is formed in the epitaxial layer and underlying substrate. The transistor channel region is in the relatively lightly doped epitaxial layer, but the underlying doped substrate layer helps minimize short channel effects.

14 Claims, 1 Drawing Sheet

METHOD OF MAKING A FIELD EFFECT TRANSISTOR HAVING A CHANNEL IN AN EPITAXIAL SILICON LAYER

This is a Division of application Ser. No. 08/350,504, filed Dec. 6, 1994 now U.S. Pat. No. 6,064,077, which is a continuation of application Ser. No. 08/254,286, filed Jun. 6, 1994, now abandoned, which is a continuation of application Ser. No. 07/752,863, filed Aug. 30, 1991, now abandoned.

BACKGROUND OF THE INVENTION

1. Field of the Invention

The present invention relates generally to integrated circuit devices, and more specifically to a transistor suitable for use in integrated circuit devices having small feature sizes.

2. Description of the Prior Art

As semiconductor integrated circuit continue to become smaller, it becomes increasingly difficult to fabricate transistors which operate reliably and predictably. As device feature sizes shrink to dimensions well below one micron, transistors become strongly affected by short channel effects.

Short channel effects occur as a result of the voltage field at the drain. Since the channel is very short, the electric fields from both the gate and drain affect the flow of current through the channel, changing operation of the transistor from the desired parameters. If the drain electric field is strong enough, the depletion region can extend all the way to the source, resulting in punch through.

Short channel effects can mostly be negated by increasing the dopant concentration in the channel region. However, undesirable side effects occur as a result of increasing the dopant concentration. Carrier mobility is degraded, lowering transistor gain, and threshold voltage ($V_t$) are increased.

It would be desirable to provide a transistor structure, and method for making same, which provides improved avoidance of short channel effects without unduly adversely affecting transistor operating characteristics. It would be further desirable for such a structure and method to be compatible with widely available fabrication techniques.

SUMMARY OF THE INVENTION

Therefore, according to the present invention, a method for fabricating an integrated circuit transistor begins with doping the substrate in the device active areas after field oxide regions have been formed. This dopant helps to reduce short channel transistor effects. A thin layer of epitaxial silicon is then grown over the substrate active regions. A field effect transistor is formed in the epitaxial layer and underlying substrate. The transistor channel region is in the relatively lightly doped epitaxial layer, but the underlying doped substrate layer helps minimize short channel effects.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
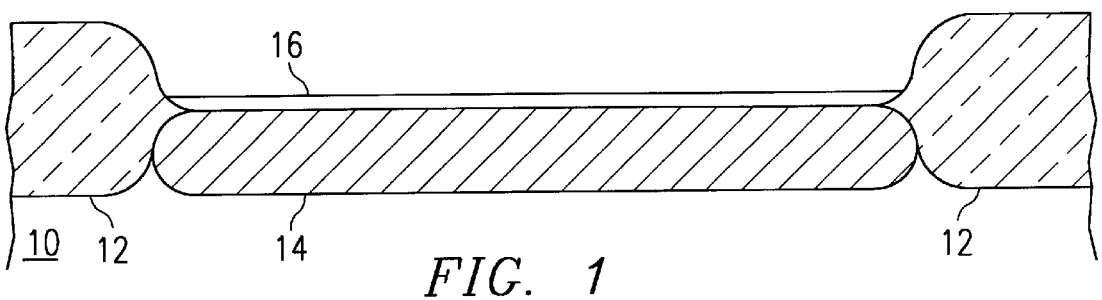
FIGS. 1–3 illustrate one preferred method for forming integrated circuit structures according to the present invention.

Referring to FIG. 1, a substrate 10 is used for the formation of integrated circuit devices. Field oxide regions 12 are formed in the substrate 10 as known in the art. An upper surface region 14 of the substrate 10 is doped with a moderate amount of impurities.

The dopant concentration for region 14 is selected to be a moderate level which allows short channel effects to be controlled. If an n-channel transistor is to be formed, the region 14 can be doped with, for example, approximately $5 \times 10^{17}$ atoms/cm$^3$ of boron. The dopant in region 14 may be implanted or diffused into the substrate 10 as known in the art.

A thin epitaxial silicon region 16 is then grown on the substrate 10. Epitaxial region 16 may be grown using molecular beam epitaxy (MBE) or a low temperature epitaxial growth process. Low temperature processes, less than approximately 850° C., are preferably used to minimize outdiffusion of dopant from the region 14. Layer 16 is preferably grown to a thickness of approximately 500–1000 angstroms, and will contain the channel of the field effect transistor to be formed.

Figure 2:
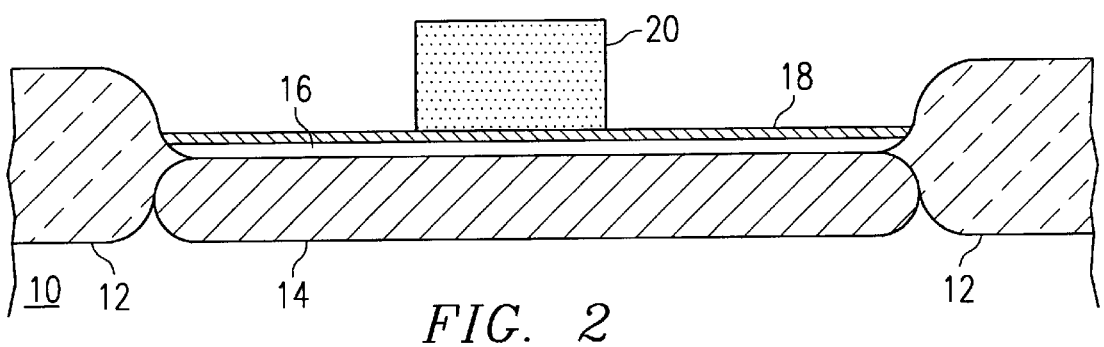

Referring to FIG. 2, a thermal oxidation step is performed to convert a portion of the epitaxial layer 16 to gate oxide 18. Gate oxide layer 18 is preferably less than approximately 150 angstroms thick. A polycrystalline silicon layer is then deposited over the entire device and patterned as known in the art to form a polycrystalline silicon gate electrode 20. If desired, the polycrystalline silicon layer can be doped before patterning, and the polycrystalline silicon electrode 20 can be formed to include a refractory metal silicide to improve conductivity. Such techniques are well known in the art.

Figure 3:
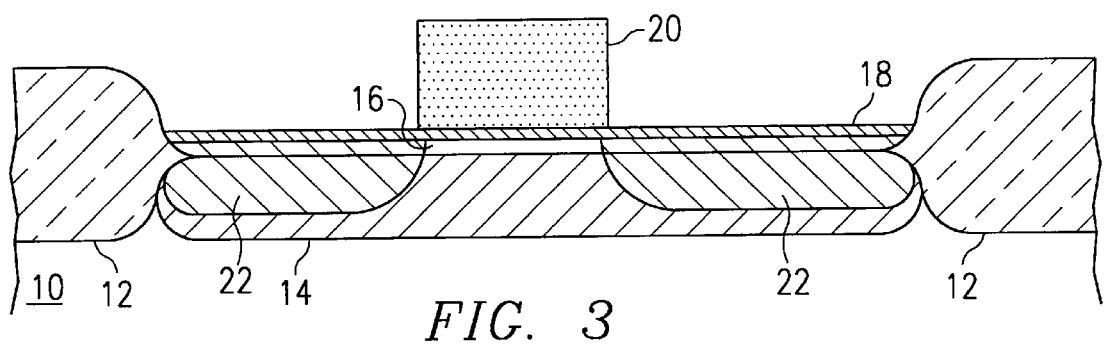

Referring to FIG. 3, source drain regions 22 are formed in the substrate 10 and epitaxial layer 18 by implantation and anneal as known in the art. The source/drain region 22 junction extends into the moderately doped region 14. The extension of this junction into the region 14 minimizes the short channel effect due to its higher dopant concentration. The channel of the transistor is formed in the epitaxial layer 16 beneath the gate electrode 20. Since the epitaxial layer 16 is relatively lightly doped, the resulting transistor has good operating characteristics. If desired, prior to the formation of the polycrystalline silicon layer over the gate oxide layer 18, a $V_t$ adjust implant can be made into the epitaxial layer 16 in order to set the threshold voltage of the transistor to a desired value. Dopant outdiffusion from the moderately doped region 14 during epitaxial growth and later processing steps will also tend to vary the threshold voltage somewhat, and the $V_t$ implant may not be necessary.

Figure 4:
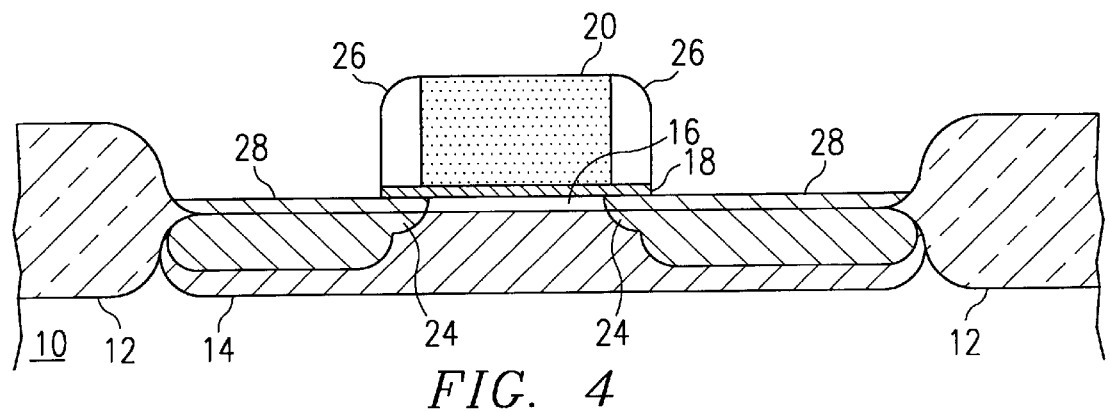
FIG. 4 illustrates an alternative integrated circuit structure formed in accordance with the present invention.

Referring to FIG. 4, the technique of growing the additional epitaxial layer 16 can be used to form a self-aligned, lightly doped drain (LDD) structure. As known in the art, after patterning of the gate electrode 20, an LDD implant is made to form lightly doped drain regions 24. Sidewall oxide regions 26 are then formed along side the gate electrode 20 using an oxide deposition and anisotropic etch as known in the art, followed by implant of the heavily doped source/drain regions 28. As before, the extension of the source/drain region junctions into the moderately doped region 14 reduces short channel effects, while the formation of the transistor channel in the lighter doped epitaxial layer 16 underneath a gate 20 produces a transistor having good operating characteristics.

As an alternative to growing the epitaxial layer 16 in FIG. 1, a selective amorphous silicon deposition may be performed followed by a solid-phase epitaxial regrowth of the amorphous silicon. Such a regrowth step may be performed at approximately 550° C.–600° C. as known in the art.

As will be appreciated by those skilled in the art, the technique described above results in a transistor which suffers minimal degradation from short channel effects, and has good operating characteristics due to the channel being formed in a relatively lightly doped epitaxial layer. Formation of the epitaxial layer 16 adds only minimal complexity to standard process flows, and allows high quality transistors to be fabricated using feature sizes of approximately one-half micron and less.

While the invention has been particularly shown and described with reference to a preferred embodiment, it will be understood by those skilled in the art that various changes in form and detail may be made therein without departing from the spirit and scope of the invention.

What is claimed is:

1. A method for forming an integrated circuit device, comprising the steps of:
    forming a region in a substrate which is doped with impurities at a level which controls short channel device effects;
    forming a thin layer of monocrystalline silicon over the substrate adjacent the region, to a thickness of between approximately 500 and 1000 angstroms at a temperature of less than 850° C.;
    forming a gate insulating layer over the monocrystalline silicon layer;
    forming a gate electrode over the gate insulating layer; and
    forming source/drain regions in the monocrystalline silicon layer on either side of the gate electrode and extending into but not through the region in the substrate, leaving a channel region underneath the gate electrode in the monocrystalline silicon layer having a length of less than one half micron.

2. The method of claim 1, wherein the monocrystalline silicon layer comprises a layer of epitaxial silicon.

3. The method of claim 1, wherein said step of forming a monocrystalline silicon layer comprises the step of:
    growing a layer of epitaxial silicon on the substrate at a temperature less than approximately 850° C.

4. The method of claim 3, wherein said growing step comprises the step of:
    growing the epitaxial silicon layer using molecular beam epitaxy.

5. The method of claim 3, wherein said growing step comprises the step of:
    growing the epitaxial silicon layer using low temperature epitaxy.

6. The method of claim 1, wherein said step of forming a monocrystalline silicon layer comprises the steps of:
    forming an amorphous silicon layer over the substrate; and
    converting the amorphous silicon layer to monocrystalline silicon using solid-phase epitaxial regrowth.

7. The method of claim 1, further comprising the steps of:
    after said gate electrode forming step, implanting a dose of impurities to form lightly doped drain regions; and
    forming insulating sidewall regions alongside the gate electrode, wherein said step of forming source/drain regions forms heavily doped regions spaced away from under the gate electrode by approximately the width of the sidewall regions.

8. The method of claim 1, wherein the gate insulating layer comprises a layer of oxide.

9. The method of claim 8, wherein the oxide layer is thermally grown.

10. The method of claim 1, wherein the region in the substrate doped with impurities has an impurity concentration of approximately $5 \times 10^{17}$ atoms/cm$^3$.

11. The method of claim 1, wherein the gate electrode has a width which defines a channel length of less than approximately 0.5 micron.

12. A method for forming an integrated circuit device, comprising:
    forming an isolation oxide on a substrate, the isolation oxide having an opening therethrough exposing an active region within the substrate;
    moderately doping the active region in the substrate with impurities at a level which controls short channel device effects;
    depositing a layer of undoped monocrystalline silicon on the substrate over the moderately doped active region and within the opening through the isolation oxide to a thickness of between approximately 500 and 1000 Å and at a temperature of less than 850° C.;
    forming a gate over the undoped silicon layer; and
    forming source/drain regions on either side of the gate, the source/drain regions extending through the undoped silicon layer and into but not through the doped active region in the substrate and defining a channel region beneath the gate having a length of less than one half micron.

13. The method of claim 12, wherein the step of moderately doping the active region in the substrate with impurities at a level which controls short channel device effects further comprises:
    doping the active region with boron to a level of $5 \times 10^{17}$ atoms/cm$^3$.

14. The method of claim 12, wherein the step of forming source/drain regions on either side of the gate further comprises:
    forming lightly doped source/drain regions on either side of the gate, the lightly doped source/drain regions extending through the undoped silicon layer and into but not through the doped active region in the substrate and defining the channel region;
    forming sidewall spacers adjacent the gate; and
    forming heavily doped source/drain regions on either side of the gate in regions not covered by the sidewall spacers.

* * * * *